United States Patent
Huang et al.

(10) Patent No.: US 9,000,551 B2
(45) Date of Patent: Apr. 7, 2015

(54) HIGH PERFORMANCE SURFACE ILLUMINATING GESI PHOTODIODES

(71) Applicant: SiFotonics Technologies Co., Ltd., Woburn, MA (US)

(72) Inventors: Mengyuan Huang, Beijing (CN); Tuo Shi, Beijing (CN); Pengfei Cai, Beijing (CN); Dong Pan, Andover, MA (US)

(73) Assignee: SiFotonics Technologies Co, Ltd., Woburn, MA (US)

( * ) Notice: Subject to any disclaimer, the term of this patent is extended or adjusted under 35 U.S.C. 154(b) by 0 days.

(21) Appl. No.: 14/194,002

(22) Filed: Feb. 28, 2014

(65) Prior Publication Data

US 2014/0239301 A1    Aug. 28, 2014

Related U.S. Application Data

(60) Provisional application No. 61/851,040, filed on Feb. 28, 2013.

(51) Int. Cl.
| | |
|---|---|
| *H01L 29/66* | (2006.01) |
| *H01L 31/107* | (2006.01) |
| *H01L 31/0376* | (2006.01) |

(52) U.S. Cl.
CPC ...... *H01L 31/1075* (2013.01); *H01L 31/03762* (2013.01)

(58) Field of Classification Search
CPC ............ H01L 25/167; H01L 27/14643; H01L 29/288; H01L 31/0216; H01L 31/1075; H01L 31/03762
USPC ........... 257/186, 199, 481, E21.357, E21.355
See application file for complete search history.

(56) References Cited

U.S. PATENT DOCUMENTS

| | | | |
|---|---|---|---|
| 2013/0164918 A1* | 6/2013 | Liang et al. | 438/478 |
| 2013/0202005 A1* | 8/2013 | Dutt | 372/50.1 |

* cited by examiner

*Primary Examiner* — Brook Kebede
(74) *Attorney, Agent, or Firm* — Han IP Corporation

(57) ABSTRACT

A GeSi avalanche photodiode (APD includes an anti-reflection structure, a Ge absorption region, and a resonance cavity enhanced (RCE) reflector. The anti-reflection structure includes one or more dielectric layers and a top contact layer which is heavily doped with dopants of a first polarity. The RCE reflector includes: an intrinsic or lightly doped Si multiplication layer, a Si contact layer which is heavily doped with dopants of a second polarity opposite the first polarity, a Si cavity length compensation layer, a buried oxide (BOX) layer, and a Si substrate.

20 Claims, 5 Drawing Sheets

500

000
HIGH PERFORMANCE SURFACE ILLUMINATING GESI PHOTODIODES

CROSS-REFERENCE TO RELATED PATENT APPLICATION

This application is the non-provisional application of, and claims the priority benefit of U.S. Patent Application No. 61/851,040, filed on Feb. 28, 2013, which is herein incorporated by reference in its entirety.

TECHNICAL FIELD

The present disclosure is related to photodiodes and, in particular, to high performance surface illuminating photodiodes.

BACKGROUND

When a photodiode is operating at wavelength beyond the bandgap of its absorber material, such as L band for germanium for example, the absorption efficiency tends to become very low. Undesirably, the resultant low responsivity limits the performance of GeSi photodiodes in the wavelength range from 1.55 µm to 1.6 µm. Further, for a normal incident photodiode to operate at very high data rate such as 25 Gb/s or higher, the absorption layer thereof needs to be very thin in order to reach a high 3 dB bandwidth. However, a thin absorber tends to degrade the responsivity of the photodiode and negatively impact the device performance.

SUMMARY

In order to provide a high speed high performance GeSi photodiode operating at 800 nm~1600 nm, the present disclosure describes a normal incident avalanche photodiode with a novel resonance cavity enhanced (RCE) reflector.

In one aspect, a GeSi avalanche photodiode (APD) may include an anti-reflection structure, a Ge absorption region on which the anti-reflection structure is disposed, and a RCE reflector on which the Ge absorption region is disposed. The anti-reflection structure may include one or more dielectric layers and a top contact layer on which the one or more dielectric layers are disposed. The top contact layer may be heavily doped with dopants of a first polarity. The RCE reflector may include: an intrinsic or lightly doped Si multiplication layer, a Si contact layer on which the Si multiplication layer is disposed, a Si cavity length compensation layer on which the Si contact layer is disposed, a BOX layer on which the Si cavity length compensation layer is disposed, and a Si substrate on which the BOX layer is disposed. The Si contact layer may be heavily doped with dopants of a second polarity opposite the first polarity, In one embodiment, the first polarity may be p-type and the second polarity may be n-type.

In one embodiment, the top contact layer heavily doped with dopants of the first polarity may include a Ge cavity length compensation layer and an amorphous Si layer disposed on the Ge cavity length compensation layer. The Ge cavity length compensation layer may be heavily doped with dopants of the first polarity. The amorphous Si layer may be heavily doped with dopants of the first polarity.

In one embodiment, a bottom reflectivity of the RCE structure may depend on a thickness of the BOX layer and a thickness of a sum of the Si multiplication layer, the Si contact layer and the Si cavity compensation layer.

In one embodiment, a thickness of the Si cavity length compensation layer may be less than 500 nm.

In one embodiment, a reflectivity of the anti-reflection structure for top surface reflection may be less than 10%.

In one embodiment, the reflectivity of the anti-reflection structure for top surface reflection may be approximately 5%.

In one embodiment, the one or more dielectric layers may include SiNx, SiO2, SiNOx, TiO2, ITO, ZnS, MgF2, or ZnO. Here, x is a positive integer.

In one embodiment, a thickness of the Ge cavity length compensation layer may be less than 500 nm.

In one embodiment, the GeSi APD may further include a Si charge layer doped with dopants of the first polarity and disposed between the absorption region and the RCE reflector.

In another aspect, a GeSi photodiode (PD) may include an anti-reflection structure, a Ge absorption region on which the anti-reflection structure is disposed, and a RCE reflector on which the Ge absorption region is disposed. The anti-reflection structure may include one or more dielectric layers and a top contact layer on which the one or more dielectric layers are disposed. The top contact layer may be heavily doped with dopants of a first polarity. The RCE reflector may include: a Si contact layer heavily doped with dopants of a second polarity opposite the first polarity, a Si cavity length compensation layer on which the Si contact layer is disposed, a BOX layer on which the Si cavity length compensation layer is disposed, and a Si substrate on which the BOX layer is disposed.

In one embodiment, the first polarity may be p-type and the second polarity may be n-type. Alternatively, the first polarity may be n-type and the second polarity may be p-type.

In one embodiment, the top contact layer heavily doped with dopants of the first polarity may include a Ge cavity length compensation layer and an amorphous Si layer disposed on the Ge cavity length compensation layer. The Ge cavity length compensation layer may be heavily doped with dopants of the first polarity. The amorphous Si layer may be heavily doped with dopants of the first polarity.

In one embodiment, a bottom reflectivity of the RCE structure may depend on a thickness of the BOX layer and a thickness of a sum of the Si contact layer and the Si cavity compensation layer.

In one embodiment, a thickness of the Si cavity length compensation layer may be less than 500 nm.

In one embodiment, a reflectivity of the anti-reflection structure for top surface reflection may be less than 10%.

In one embodiment, the reflectivity of the anti-reflection structure for top surface reflection may be approximately 5%.

In one embodiment, the one or more dielectric layers may include SiNx, SiO2, SiNOx, TiO2, ITO, ZnS, MgF2, or ZnO. Here, x is a positive integer.

In one embodiment, a thickness of the Ge cavity length compensation layer may be less than 500 nm.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

The present disclosure provides a normal incident avalanche photodiode (APD) with a resonance cavity enhanced (RCE) reflector that can achieve high performance and operate at 800 nm~1600 nm.

Figure 1:
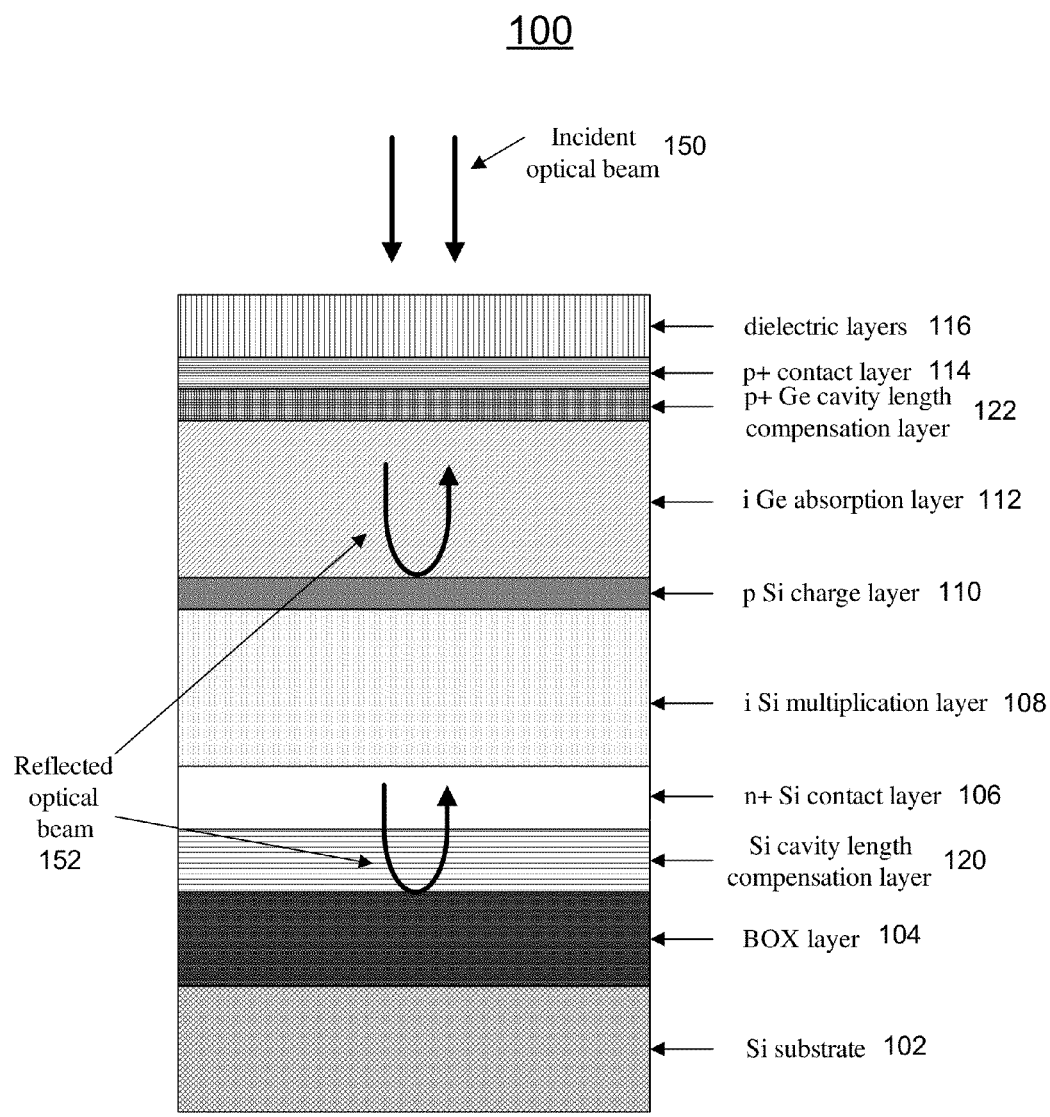
FIG. 1 is a cross-sectional view of a novel GeSi avalanche photodiode (APD) with a RCE reflector in accordance with an embodiment of the present disclosure.
Figure 2:
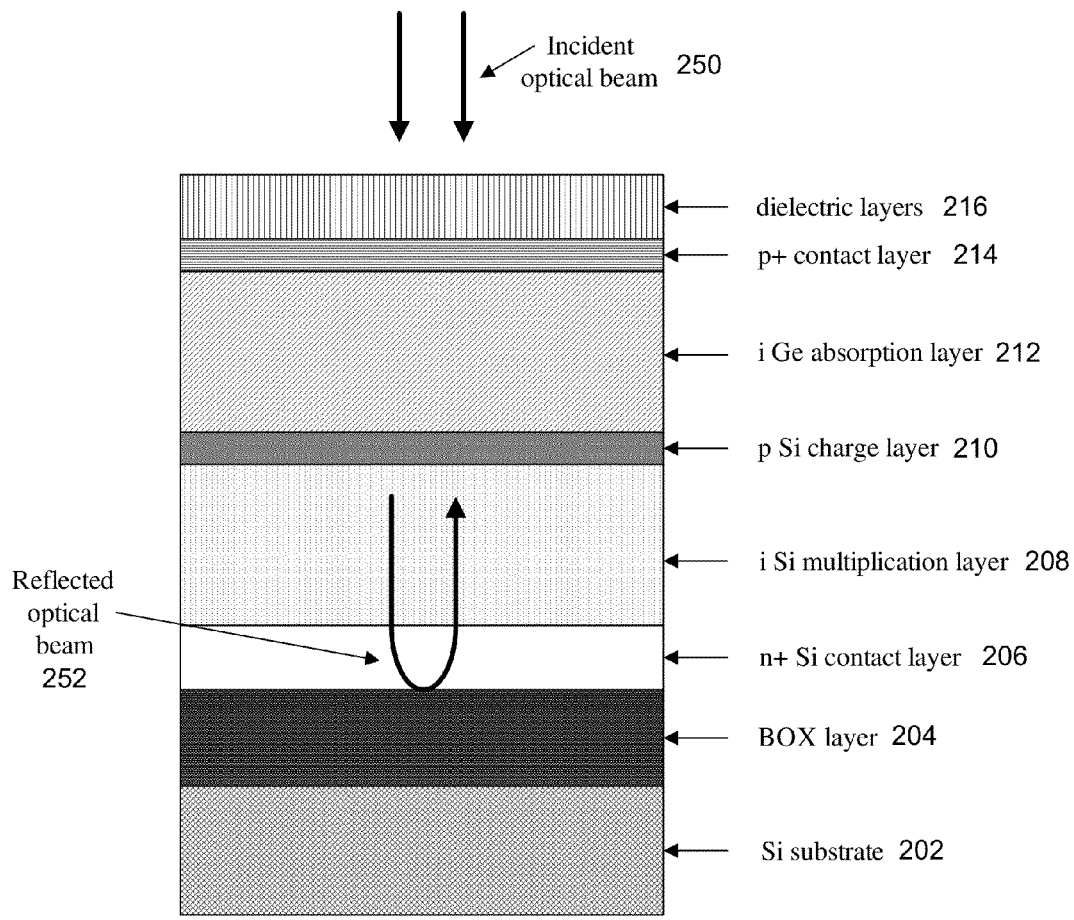
FIG. 2 is a cross-sectional view of a conventional GeSi APD.

FIG. 1 illustrates a novel GeSi APD 100 with a RCE reflector in accordance with an embodiment of the present disclosure. FIG. 2 illustrates a conventional GeSi APD 200. The following description of GeSi APD 100 refers to FIGS. 1 and 2.

As shown in FIG. 2, a conventional GeSi APD such as the conventional GeSi APD 200 typically includes a silicon (Si) substrate 202, a buried oxide (BOX) layer 204 disposed on the Si substrate 202, an n-type heavily-doped Si contact layer 206 disposed on the BOX layer 204, an intrinsic Si multiplication layer 208 disposed on the heavily-doped Si contact layer 206, a p-type Si charge layer 210 disposed on the intrinsic Si multiplication layer 208, an intrinsic germanium (Ge) absorption layer 212 disposed on the p-type Si charge layer 210, a p-type heavily-doped contact layer 214 disposed on the intrinsic Ge absorption layer 212, and one or more dielectric layers 216 disposed on the p-type heavily-doped contact layer 214.

When an incident optical beam 250 is incident on the conventional GeSi APD 200, the incident optical beam 250 traverses through part of the conventional GeSi APD 200 until it is reflected by the BOX layer 204 to become a reflected optical beam 252.

Different from the structure of conventional GeSi APDs, such as the conventional GeSi APD 200, the novel GeSi APD 100 in accordance with the present disclosure includes a number of novel components in additional to other components that are similar to those of the conventional GeSi APD 200. Specifically, the GeSi APD 100 may include a top anti-reflection structure, a Ge absorption region, and a bottom RCE reflector. The top anti-reflection structure may include, at least, one or more dielectric layers and a top contact layer. In one embodiment, the one or more dielectric layers may include a $SiO_2$ layer and/or a $Si_3N_4$ layer. In one embodiment, the top contact layer may be heavily doped with dopants of a first polarity, e.g., p-type dopants. The bottom RCE reflector may include, at least, an intrinsic or lightly doped Si multiplication layer, a Si contact layer heavily doped with dopants of a second polarity opposite the first polarity, e.g., n-type dopants, a Si cavity length compensation layer, a BOX layer, and a Si substrate.

Additional differences between conventional GeSi APDs and embodiments of the novel GeSi APD in accordance with the present disclosure are highlighted below.

Conventional GeSi APDs typically use different BOX layers to adjust the bottom reflectivity. In contrast, the bottom RCE reflector of the novel GeSi APD of the present disclosure may use both the thickness of the BOX layer and the thickness of a sum of the Si multiplication layer, the Si contact layer and the Si cavity length compensation layer to adjust the bottom reflectivity.

The thickness of the Si cavity compensation layer of the novel GeSi APD of the present disclosure may depend on incident wavelength, which typically is less than 500 nm for wavelength in the range of 800 nm~1600 nm.

The process procedure for manufacturing conventional GeSi APDs typically starts with n-type substrate implantation on the top side of Si of silicon on insulator (SOI) wafers. In contrast, the process procedure for manufacturing the novel GeSi APD of the present disclosure deposits a Si layer on SOI wafer to ensure the thickness of Si cavity length compensation layer. Also, SOI wafer with special top Si thickness matching RCE reflector requirements may be selected to make the novel GeSi APD of the present disclosure.

Different from conventional GeSi APDs, the top anti-reflection structure of the novel GeSi APD of the present disclosure has a reflectivity target for top surface reflection (<10%), with a special target approximately equal to 5%.

The Ge p+ doped layer of the novel GeSi APD of the present disclosure may be formed by Ge deposition process with in-situ p+ doping after intrinsic Ge growth, or ion-implantation after intrinsic Ge deposition.

Different from conventional GeSi APDs, the one or more dielectric layers of the anti-reflection structure of the novel GeSi APD of the present disclosure may be formed by $SiN_x$, $SiO_2$, $SiNO_x$, $TiO_2$, ITO, ZnS, $MgF_2$, ZnO, or other materials. Here, x is a positive integer. The dielectric layers may be a single-layer structure, a two-layer structure, or a multiple-layer structure.

In addition, the present disclosure also provides a novel GeSi photodiode (PD) with a RCE reflector, shown in FIGS. 3 and 4 to be described below, which may include a top anti-reflection structure and a bottom RCE reflector similar to those of the novel GeSi APD of the present disclosure.

Example Implementations

FIG. 1 illustrates an example implementation of the GeSi APD 100. As shown in FIG. 1, the GeSi APD 100 in accordance with the present disclosure may include a number of new layers in additional to other layers that are similar to those of the conventional GeSi APD 200. Specifically, the GeSi APD 100 may include a Si substrate 102, a BOX layer 104 disposed on the Si substrate 102, a Si cavity length compensation layer 120 disposed on the BOX layer 104, a heavily-doped Si contact layer 106 which is doped with dopants of the second polarity and disposed on the Si cavity length compensation layer 120, an intrinsic Si multiplication layer 108 disposed on the heavily-doped Si contact layer 106, a Si charge layer 110 which is doped with dopants of the first polarity and disposed on the intrinsic Si multiplication layer 108, an intrinsic Ge absorption layer 112 disposed on the Si charge layer 110, a heavily-doped Ge cavity length compensation layer 122 which is doped with dopants of the first polarity and disposed on the intrinsic Ge absorption layer 112, a heavily-doped contact layer 114 which is doped with dopants of the first polarity and disposed on the heavily-doped Ge cavity length compensation layer 122, and one or more dielectric layers 116 disposed on the heavily-doped contact layer 114.

In one embodiment, the first polarity is p-type and the second polarity is n-type. Accordingly, in such implementation the heavily-doped Si contact layer 106 is an n+ Si contact layer, the Si charge layer 110 is a p-type Si charge layer, the heavily-doped Ge cavity length compensation layer 122 is a p+ Ge cavity length compensation layer, and the heavily-doped contact layer 114 is a p+ contact layer.

When an incident optical beam 150 is incident on the GeSi APD 100, the incident optical beam 150 traverses through part of the GeSi APD 100 until it is reflected by the Si charge layer 110 and the BOX layer 104 to become a reflected optical beam 152.

Figure 3:
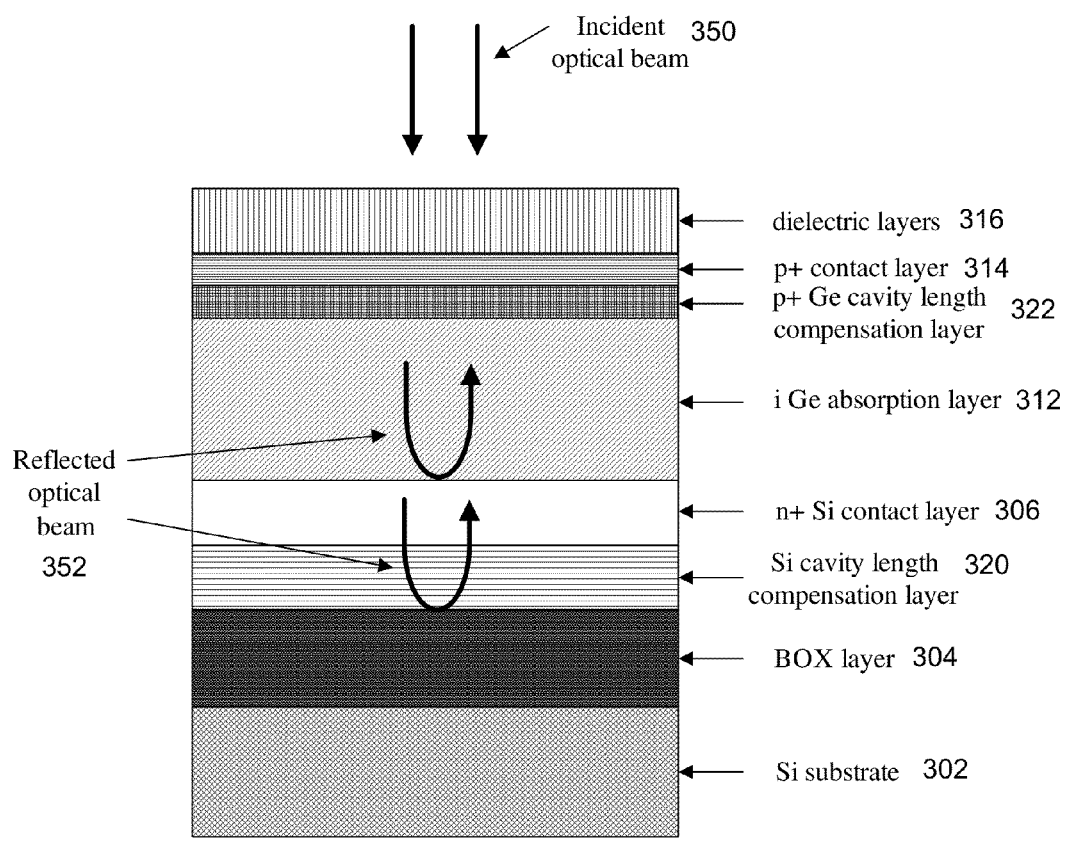
FIG. 3 is a cross-sectional view of an n-substrate GeSi photodiode (PD) with a RCE reflector in accordance with an embodiment of the present disclosure.

FIG. 3 illustrates an n-substrate GeSi PD 300 with a RCE reflector in accordance with an embodiment of the present disclosure. As shown in FIG. 3, the GeSi PD 300 in accordance with the present disclosure may include a Si substrate 302, a BOX layer 304 disposed on the Si substrate 302, a Si cavity length compensation layer 320 disposed on the BOX layer 304, a heavily-doped Si contact layer 306 which is doped with dopants of the second polarity and disposed on the Si cavity length compensation layer 320, an intrinsic Ge absorption layer 312 disposed on the heavily-doped Si contact layer 306, a heavily-doped Ge cavity length compensation layer 322 which is doped with dopants of the first polarity and disposed on the intrinsic Ge absorption layer 312, a heavily-doped contact layer 314 which is doped with dopants of the first polarity and disposed on the heavily-doped Ge cavity length compensation layer 322, and one or more dielectric layers 316 disposed on the heavily-doped contact layer 314.

In one embodiment, the first polarity is p-type and the second polarity is n-type. Accordingly, in such implementation the heavily-doped Si contact layer 306 is an n+ Si contact layer, the heavily-doped Ge cavity length compensation layer 322 is a p+ Ge cavity length compensation layer, and the heavily-doped contact layer 314 is a p+ contact layer.

When an incident optical beam 350 is incident on the GeSi PD 300, the incident optical beam 350 traverses through part of the GeSi PD 300 until it is reflected by the heavily-doped Si contact layer 306 and the BOX layer 304 to become a reflected optical beam 352.

Figure 4:
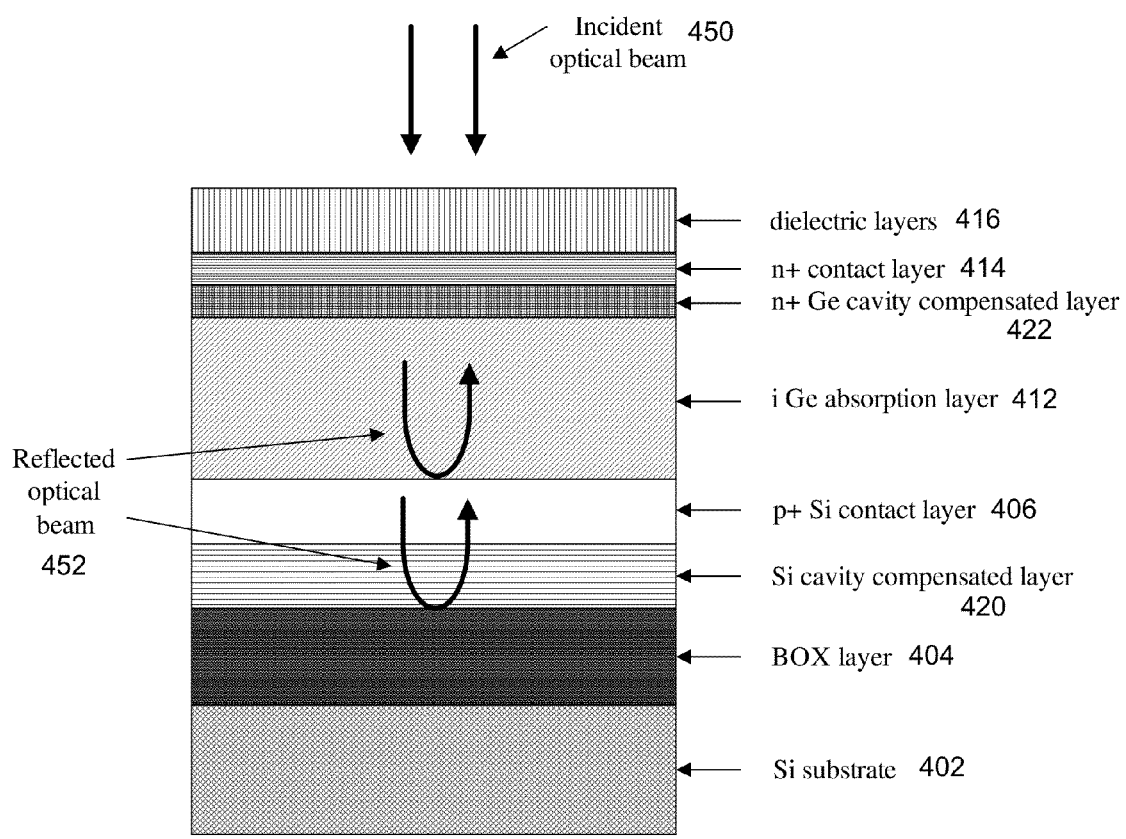
FIG. 4 is a cross-sectional view of a p-substrate GeSi PD with a RCE reflector in accordance with an embodiment of the present disclosure.

FIG. 4 illustrates a p-substrate GeSi PD 400 with a RCE reflector in accordance with an embodiment of the present disclosure. As shown in FIG. 4, the GeSi PD 400 in accordance with the present disclosure may include a Si substrate 402, a BOX layer 404 disposed on the Si substrate 402, a Si cavity length compensation layer 420 disposed on the BOX layer 404, a heavily-doped Si contact layer 406 which is doped with dopants of the first polarity and disposed on the Si cavity length compensation layer 420, an intrinsic Ge absorption layer 412 disposed on the heavily-doped Si contact layer 406, a heavily-doped Ge cavity length compensation layer 422 which is doped with dopants of the second polarity and disposed on the intrinsic Ge absorption layer 412, a heavily-doped contact layer 414 which is doped with dopants of the second polarity and disposed on the heavily-doped Ge cavity length compensation layer 422, and one or more dielectric layers 416 disposed on the heavily-doped contact layer 414.

In one embodiment, the first polarity is p-type and the second polarity is n-type. Accordingly, in such implementation the heavily-doped Si contact layer 406 is a p+ Si contact layer, the heavily-doped Ge cavity length compensation layer 422 is an n+ Ge cavity length compensation layer, and the heavily-doped contact layer 414 is an n+ contact layer.

When an incident optical beam 450 is incident on the GeSi PD 400, the incident optical beam 450 traverses through part of the GeSi PD 400 until it is reflected by the heavily-doped Si contact layer 406 and the BOX layer 404 to become a reflected optical beam 452.

Figure 5:
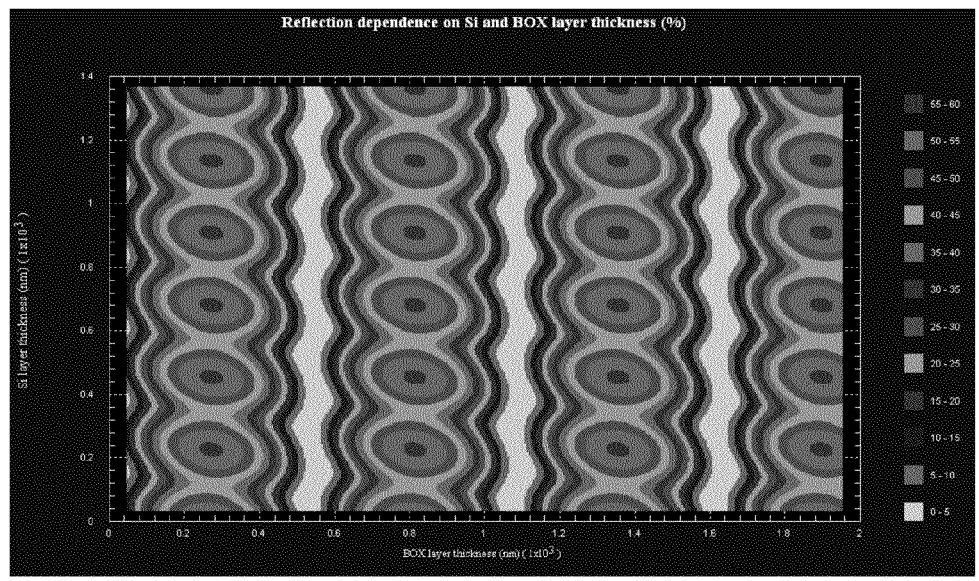
FIG. 5 is a diagram showing calculated reflectivity with different thicknesses for buried oxide (BOX) and Si layers in accordance with an embodiment of the present disclosure.

FIG. 5 is a diagram 500 that shows calculated reflectivity with different thicknesses for BOX and Si layers in accordance with an embodiment of the present disclosure. In the example shown in FIG. 5, the reflectivity is calculated at 1577 nm. As can be seen from FIG. 5, the thickness of the BOX layer and the thickness of a sum of the Si multiplication layer, the Si contact layer and the Si cavity compensation layer have periodic impact on the total reflectivity.

Example Highlighted Features

In view of the above, a GeSi APD may include an anti-reflection structure, a Ge absorption region on which the anti-reflection structure is disposed, and a RCE reflector on which the Ge absorption region is disposed. The anti-reflection structure may include one or more dielectric layers and a top contact layer on which the one or more dielectric layers are disposed. The top contact layer may be heavily doped with dopants of a first polarity. The RCE reflector may include: an intrinsic or lightly doped Si multiplication layer, a Si contact layer on which the Si multiplication layer is disposed, a Si cavity length compensation layer on which the Si contact layer is disposed, a BOX layer on which the Si cavity length compensation layer is disposed, and a Si substrate on which the BOX layer is disposed. The Si contact layer may be heavily doped with dopants of a second polarity opposite the first polarity, In one embodiment, the first polarity may be p-type and the second polarity may be n-type.

In one embodiment, the top contact layer heavily doped with dopants of the first polarity may include a Ge cavity length compensation layer and an amorphous Si layer disposed on the Ge cavity length compensation layer. The Ge cavity length compensation layer may be heavily doped with dopants of the first polarity. The amorphous Si layer may be heavily doped with dopants of the first polarity.

In one embodiment, a bottom reflectivity of the RCE structure may depend on a thickness of the BOX layer and a thickness of a sum of the Si multiplication layer, the Si contact layer and the Si cavity compensation layer.

In one embodiment, a thickness of the Si cavity length compensation layer may be less than 500 nm.

In one embodiment, a reflectivity of the anti-reflection structure for top surface reflection may be less than 10%.

In one embodiment, the reflectivity of the anti-reflection structure for top surface reflection may be approximately 5%.

In one embodiment, the one or more dielectric layers may include SiNx, SiO2, SiNOx, TiO2, ITO, ZnS, MgF2, or ZnO. Here, x is a positive integer.

In one embodiment, a thickness of the Ge cavity length compensation layer may be less than 500 nm.

In one embodiment, the GeSi APD may further include a Si charge layer doped with dopants of the first polarity and disposed between the absorption region and the RCE reflector.

In another aspect, a GeSi PD may include an anti-reflection structure, a Ge absorption region on which the anti-reflection structure is disposed, and a RCE reflector on which the Ge absorption region is disposed. The anti-reflection structure may include one or more dielectric layers and a top contact layer on which the one or more dielectric layers are disposed. The top contact layer may be heavily doped with dopants of a first polarity. The RCE reflector may include: a Si contact layer heavily doped with dopants of a second polarity opposite the first polarity, a Si cavity length compensation layer on which the Si contact layer is disposed, a BOX layer on which the Si cavity length compensation layer is disposed, and a Si substrate on which the BOX layer is disposed.

In one embodiment, the first polarity may be p-type and the second polarity may be n-type. Alternatively, the first polarity may be n-type and the second polarity may be p-type.

In one embodiment, the top contact layer heavily doped with dopants of the first polarity may include a Ge cavity length compensation layer and an amorphous Si layer disposed on the Ge cavity length compensation layer. The Ge cavity length compensation layer may be heavily doped with dopants of the first polarity. The amorphous Si layer may be heavily doped with dopants of the first polarity.

In one embodiment, a bottom reflectivity of the RCE structure may depend on a thickness of the BOX layer and a thickness of a sum of the Si contact layer and the Si cavity compensation layer.

In one embodiment, a thickness of the Si cavity length compensation layer may be less than 500 nm.

In one embodiment, a reflectivity of the anti-reflection structure for top surface reflection may be less than 10%.

In one embodiment, the reflectivity of the anti-reflection structure for top surface reflection may be approximately 5%.

In one embodiment, the one or more dielectric layers may include SiNx, SiO2, SiNOx, TiO2, ITO, ZnS, MgF2, or ZnO. Here, x is a positive integer.

In one embodiment, a thickness of the Ge cavity length compensation layer may be less than 500 nm.

Additional Note

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A GeSi avalanche photodiode (APD), comprising:
   an anti-reflection structure, comprising:
      one or more dielectric layers, and
      a top contact layer on which the one or more dielectric layers are disposed, the top contact layer being heavily doped with dopants of a first polarity;
   a germanium (Ge) absorption region on which the anti-reflection structure is disposed; and
   a resonance cavity enhanced (RCE) reflector on which the Ge absorption region is disposed, the RCE reflector comprising:
      an intrinsic or lightly doped silicon (Si) multiplication layer,
      a Si contact layer on which said doped Si multiplication layer is disposed, the Si contact layer being heavily doped with dopants of a second polarity opposite the first polarity,
      a Si cavity length compensation layer on which the Si contact layer is disposed,
      a buried oxide (BOX) layer on which the Si cavity length compensation layer is disposed, and
      a Si substrate on which the BOX layer is disposed.

2. The GeSi APD of claim 1, wherein the first polarity is p-type and the second polarity is n-type.

3. The GeSi APD of claim 1, wherein the top contact layer heavily doped with dopants of the first polarity comprises:
   a Ge cavity length compensation layer heavily doped with dopants of the first polarity; and
   an amorphous Si layer heavily doped with dopants of the first polarity and disposed on the Ge cavity length compensation layer.

4. The GeSi APD of claim 1, wherein a bottom reflectivity of the RCE structure depends on a thickness of the BOX layer and a thickness of a sum of said doped Si multiplication layer, the Si contact layer and the Si cavity compensation layer.

5. The GeSi APD of claim 1, wherein a thickness of the Si cavity length compensation layer is less than 500 nm.

6. The GeSi APD of claim 1, wherein a reflectivity of the anti-reflection structure for top surface reflection is less than 10%.

7. The GeSi APD of claim 1, wherein the reflectivity of the anti-reflection structure for top surface reflection is approximately 5%.

8. The GeSi APD of claim 1, wherein the one or more dielectric layers comprise $SiN_x$, $SiO_2$, $SiNO_x$, $TiO_2$, ITO, ZnS, $MgF_2$, or ZnO, wherein x is a positive integer.

9. The GeSi APD of claim 1, wherein a thickness of the Ge cavity length compensation layer is less than 500 nm.

10. The GeSi APD of claim 1, further comprising a Si charge layer doped with dopants of the first polarity and disposed between the absorption region and the RCE reflector.

11. A GeSi photodiode (PD), comprising:
    an anti-reflection structure, comprising:
       one or more dielectric layers, and
       a top contact layer on which the one or more dielectric layers are disposed, the top contact layer being heavily doped with dopants of a first polarity;
    a germanium (Ge) absorption region on which the anti-reflection structure is disposed; and
    a resonance cavity enhanced (RCE) reflector on which the Ge absorption region is disposed, the RCE reflector comprising:
       a Si contact layer heavily doped with dopants of a second polarity opposite the first polarity,
       a Si cavity length compensation layer on which the Si contact layer is disposed,
       a buried oxide (BOX) layer on which the Si cavity length compensation layer is disposed, and
       a Si substrate on which the BOX layer is disposed.

12. The GeSi PD of claim 11, wherein the first polarity is p-type and the second polarity is n-type.

13. The GeSi PD of claim 11, wherein the first polarity is n-type and the second polarity is p-type.

14. The GeSi PD of claim 11, wherein the top contact layer heavily doped with dopants of the first polarity comprises:
    a Ge cavity length compensation layer heavily doped with dopants of the first polarity; and
    an amorphous Si layer heavily doped with dopants of the first polarity and disposed on the Ge cavity length compensation layer.

15. The GeSi PD of claim 11, wherein a bottom reflectivity of the RCE structure depends on a thickness of the BOX layer and a thickness of a sum of the Si contact layer and the Si cavity compensation layer.

16. The GeSi PD of claim 11, wherein a thickness of the Si cavity length compensation layer is less than 500 nm.

17. The GeSi PD of claim 11, wherein a reflectivity of the anti-reflection structure for top surface reflection is less than 10%.

18. The GeSi PD of claim 11, wherein the reflectivity of the anti-reflection structure for top surface reflection is approximately 5%.

19. The GeSi PD of claim 11, wherein the one or more dielectric layers comprise $SiN_x$, $SiO_2$, $SiNO_x$, $TiO_2$, ITO, ZnS, $MgF_2$, or ZnO, wherein x is a positive integer.

20. The GeSi PD of claim 11, wherein a thickness of the Ge cavity length compensation layer is less than 500 nm.

* * * * *